United States Patent [19]
Wu

[11] Patent Number: 5,393,692
[45] Date of Patent: Feb. 28, 1995

[54] RECESSED SIDE-WALL POLY PLUGGED LOCAL OXIDATION

[75] Inventor: Lin-June Wu, Hsin-Chu, Taiwan, Prov. of China

[73] Assignee: Taiwan Semiconductor Manufacturing Company, Hsinchu, Taiwan, Prov. of China

[21] Appl. No.: 102,979

[22] Filed: Jul. 28, 1993

[51] Int. Cl.⁶ .............................................. H01L 21/76
[52] U.S. Cl. ......................................... 437/69; 437/72
[58] Field of Search ............................ 437/69, 70, 72; 148/DIG. 85, DIG. 86, DIG. 117

[56] References Cited

U.S. PATENT DOCUMENTS

| | | | |
|---|---|---|---|
| 4,829,019 | 5/1989 | Mitchell et al. | 437/69 |
| 4,927,780 | 5/1990 | Roth et al. | |
| 4,965,221 | 10/1990 | Dennison et al. | 437/70 |
| 5,175,123 | 12/1992 | Vasquez et al. | |
| 5,318,922 | 6/1994 | Lim et al. | 437/72 |
| 5,326,715 | 7/1994 | Jang et al. | 437/67 |

OTHER PUBLICATIONS

Ghezzo, M., "LOPOS: Advanced Device Isolation for a 0.8 μm CMOS/BULK Process Technology", *Journal of the Electrochemical Society*, vol. 136, No. 7, Jul./1989 pp. 1992–1996.

"Polysilicon Encapsulated Local Oxidation" by S. S. Roth et al. in IEEE Electron Device Letters, vol. 12, No. 3, Mar. 1991.

*Primary Examiner*—George Fourson
*Attorney, Agent, or Firm*—George O. Saile; Stephen B. Ackerman

[57] ABSTRACT

A method of forming a field oxide isolation region with reduced bird's beak length and planar topography is described. A first layer of pad oxide is formed on the surface of a silicon substrate. A layer of silicon nitride is formed on the surface of the first pad oxide layer. The silicon nitride layer and part of the first pad oxide layer are patterned to form an opening for the field oxide isolation region. The first pad oxide layer is removed in the area defined by the opening and simultaneously a cavity is formed in the first pad oxide layer under the silicon nitride. A second pad oxide layer is formed by oxidizing the exposed portions of the silicon substrate and the first pad oxide layer. A layer of polysilicon is deposited over the surfaces of the second pad oxide layer and the silicon nitride layer, and inside the cavity. The polysilicon layer is etched to form a polysilicon spacer adjacent to the silicon nitride layer and a polysilicon plug in the cavity. The field oxide isolation region is then formed in and on the silicon substrate. The silicon nitride layer and the remainder of the first pad oxide layer are removed. A sacrificial oxide layer is formed on the surface of the substrate, and is then removed to complete formation of the field oxide.

22 Claims, 6 Drawing Sheets

RECESSED SIDE-WALL POLY PLUGGED LOCAL OXIDATION

BACKGROUND OF THE INVENTION

1. Field of the Invention

The invention relates to the manufacture of highly dense integrated circuits and more particularly to the formation of a field oxide isolation region within the integrated circuit.

2. Description of the Prior Art

In the manufacture of highly dense integrated circuits, individual device structures are typically separated and electrically isolated by means of a field oxide isolation region. The isolation region is typically produced by the exposure of a silicon wafer to an oxidizing atmosphere while using an oxidation mask to protect regions which are not desired to be oxidized. These latter regions will be the location for the active device structures. One widely used technique for creating isolation regions is called LOCOS—for LOCal Oxidation of Silicon.

In the LOCOS technique, a pad oxide is grown on the surface of a silicon substrate. A silicon nitride layer is deposited on the surface of the pad oxide, and then patterned to create an oxidation mask. The exposed areas of the substrate are then oxidized to form the field oxide isolation regions. The oxidation mask is removed and the device structures are created in subsequent processing steps.

The LOCOS method has problems, however, especially as device geometries continue to get smaller. During oxidation, oxygen diffuses through the pad oxide to the substrate and forms an undesired "bird's beak". The bird's beak extends the field isolation region into the active device region, reducing the area in which devices can be built. At geometries less than 0.8 microns, the bird's beak length using LOCOS can no longer be tolerated.

Furthermore, the LOCOS method produces field isolation regions that have poor planarity. This nonplanar topography is inadequate to meet sub-micron lithography requirements. Non-planarity also causes the problem of "polyline necking", which results in either a narrowing or widening of a polysilicon line, and is believed to be caused by photo scattering at the steep edge of the field oxide.

Workers in the field are aware of these problems. To reduce encroachment into active device regions by the bird's beak, a layer of undoped polysilicon is added between the pad oxide and silicon nitride layers, in what is referred to as PBLOCOS, or Polysilicon Buffered LOCal Oxidation of Silicon. An example is shown in U.S. Pat. No. 4,829,019. The polysilicon layer in this invention is intended to block oxygen from diffusing into the pad oxide and substrate, thereby reducing the bird's beak length. However, PBLOCOS leads to more severe topography problems than exist with LOCOS.

Figure 1:
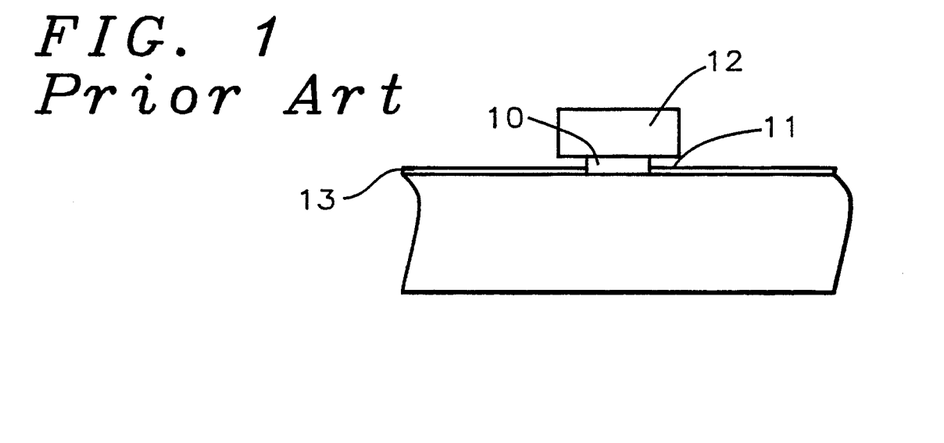
FIGS. 1 to 3 are a schematic cross-sectional representation of the Prior Art processes for forming the field oxide region of an integrated circuit.
Figure 2:
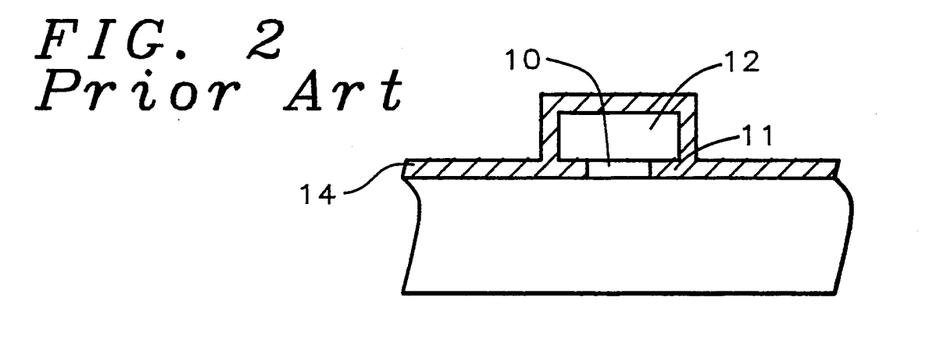

Other approaches to overcoming the solutions to the difficulties associated with LOCOS have been identified, but typically at the expense of much more complex processing. One simpler approach is described in "Polysilicon Encapsulated Local Oxidation" by S. S. Roth et al, in IEEE Electron Device Letters, Vol 12, No. 3, March 1991. In this technique, also called PELOX, a layer of pad oxide and a subsequent layer of silicon nitride are deposited on a silicon substrate, as in LOCOS, and an oxidation mask is patterned. As shown in FIG. 1, a buffered hydrofluoric solution is then used to undercut the nitride 12 and form a cavity 11 in the pad oxide 10. A thin reoxidation layer 13 is then grown by thermal oxidation of the exposed portions of silicon. Referring now to FIG. 2, a layer of polysilicon 14 is deposited on all surfaces and fills the cavity. The field oxide region is then created by thermal oxidation, and the oxidation mask removed by using standard etching techniques.

Figure 3:
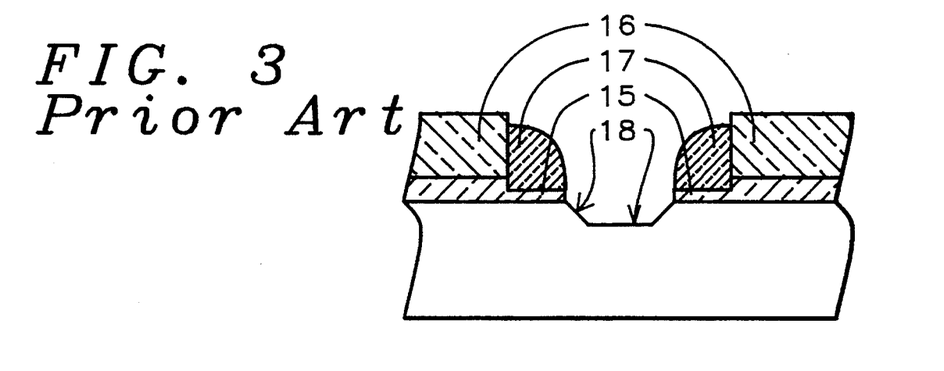

In U.S. Pat. No. 4,965,221, a layer of pad oxide and a subsequent layer of silicon nitride are deposited on a silicon substrate, as in LOCOS, and an oxidation mask is patterned. As shown in FIG. 3, a layer of oxide or polysilicon is then deposited and patterned to form spacers 17 adjacent to oxide layer 15 and nitride layer 16. These spacers are then used as a mask during an etch of recessed region 18. The field oxide region is then thermally grown and the oxidation mask removed.

SUMMARY OF THE INVENTION

It is therefore a principal object of the invention to reduce the bird's beak length of the field oxide isolation region that occurs when using the LOCOS technique to form field isolation regions in integrated circuits, without adding significant processing complexity.

It is a further object of the invention to provide a more planar topography than the prior art techniques and thus meet lithography requirements for sub-micron processing and reduce the problem of polyline necking.

These objects are achieved by forming a field oxide isolation region in and on the surface of a silicon substrate. A first layer of pad oxide is formed on the surface of the silicon substrate. A layer of silicon nitride is formed on the surface of the first pad oxide layer. The silicon nitride layer and part of the first pad oxide layer are patterned to form an opening for the field oxide isolation region. The first pad oxide layer is removed in the area defined by the opening and simultaneously a cavity is formed in the first pad oxide layer under the silicon nitride. A second pad oxide layer is formed by oxidizing the exposed portions of the silicon substrate and the first pad oxide layer. A layer of polysilicon is deposited over the surfaces of the second pad oxide layer and the silicon nitride layer, and inside the cavity. The polysilicon layer is etched to form a polysilicon spacer adjacent to the silicon nitride layer and a polysilicon plug in the cavity. The field oxide isolation region is then formed in and on the silicon substrate. The silicon nitride layer and the remainder of the first pad oxide layer are removed. A sacrificial oxide layer is formed on the surface of the substrate, and is then removed to complete formation of the field oxide.

In a further embodiment of the invention, a thickness of the silicon substrate is removed after the cavity is formed, to form a recessed area in the substrate for formation of the field oxide isolation region. This is accomplished by forming a first layer of pad oxide on the surface of the silicon substrate. A layer of silicon nitride is formed on the surface of the first pad oxide layer. The silicon nitride layer and part of the first pad oxide layer are patterned to form an opening for the field oxide isolation region. The first pad oxide layer is removed in the area defined by the opening and simultaneously a cavity is formed in the first pad oxide layer under the silicon nitride. A thickness of the silicon substrate is removed to provide a recessed area in the substrate. A second pad oxide layer is formed by oxidizing the exposed portions of the silicon substrate and the first pad oxide layer. A layer of polysilicon is deposited over the surfaces of the second pad oxide layer and the silicon nitride layer, and inside the cavity. The polysilicon layer is etched to form a polysilicon spacer adjacent to the silicon nitride layer and a polysilicon plug in the cavity. The field oxide isolation region is then formed in and on the silicon substrate. The silicon nitride layer and the remainder of the first pad oxide layer are removed. A sacrificial oxide layer is formed on the surface of the substrate, and is then removed to complete formation of the field oxide.

DESCRIPTION OF THE PREFERRED EMBODIMENTS

Figure 4:
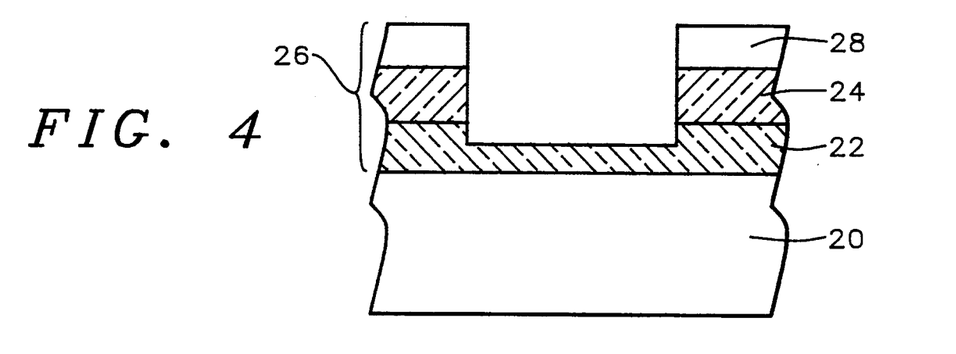
FIGS. 4, 5, 6, 7, 7A, 7B, 8, 9, 10, 11, 11A and 11B are a schematic cross-sectional representation of a new method for forming a field oxide isolation region.

Referring now more particularly to FIG. 4, there is shown an embodiment method for making the field oxide isolation region of the present invention referred to as SWAPPI (SideWAll Poly-Plugged Isolation). The first series of steps involves the formation of the pad oxide layer 22 on the silicon substrate 20. The surface of the silicon substrate 20 is thermally oxidized to form the desired pad oxide layer 22, by exposure to dry oxygen at a temperature of between about 900° and 950° C. for about 20 to 120 minutes. The thickness is between about 150 and 350 Angstroms.

Silicon nitride layer 24 is deposited on the surface of pad oxide layer 22 by Low Pressure Chemical Vapor Deposition (LPCVD) at a temperature of between about 750° and 800° C., and to a thickness of between about 1000 and 2500 Angstroms.

A reactive ion etch is now performed to create the oxidation mask 26. This mask protects regions which are not desired to be oxidized, specifically the active device regions. Using conventional lithography and etching techniques as are well known in the art to form patterned photoresist 28, an opening is created over the pad oxide 22 and substrate 20. The pad oxide 22 acts as an etch stop. Photoresist 28 is then stripped by conventional methods.

Figure 5:
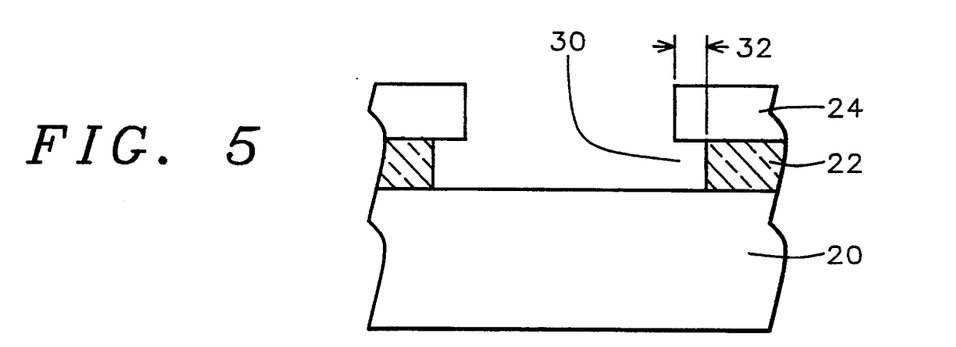

Referring now to FIG. 5, hydrofluoric (HF) acid at a ratio of 50H$_2$O:1HF by weight is used to remove the exposed portion of pad oxide 22 and simultaneously form cavity 30 under silicon nitride 24. This HF etch is for between about 6 and 20 minutes. The cavity depth 32 is between about 300 and 1200 Angstroms. The formation of cavity 30 differentiates the invention from that described in U.S. Pat. No. 4,965,221, discussed above.

Figure 6:
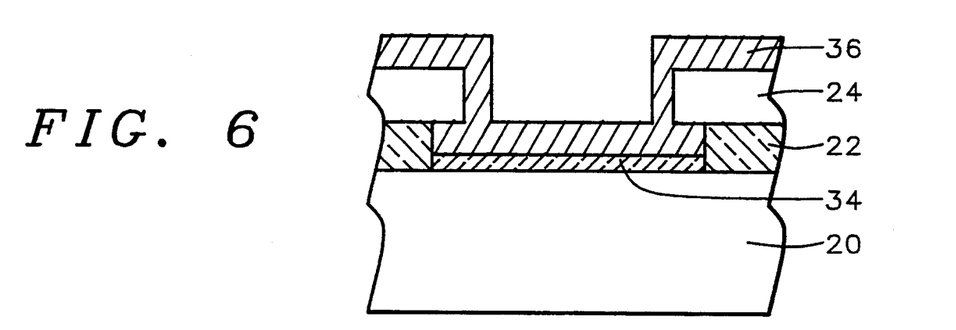

Referring now to FIG. 6, the exposed portion of the silicon substrate is thermally reoxidized in an atmosphere of dry oxygen for between about 10 and 30 minutes and at a temperature of between about 825° and 1000° C. This forms second pad oxide layer 34.

An undoped layer of polysilicon 36 is deposited over the surface of the silicon nitride 24 and pad oxide 34, typically by Low Pressure Chemical Vapor Deposition (LPCVD), at a temperature of between about 610° and 630° C. The thickness is between about 300 and 1500 Angstroms.

Figure 7:
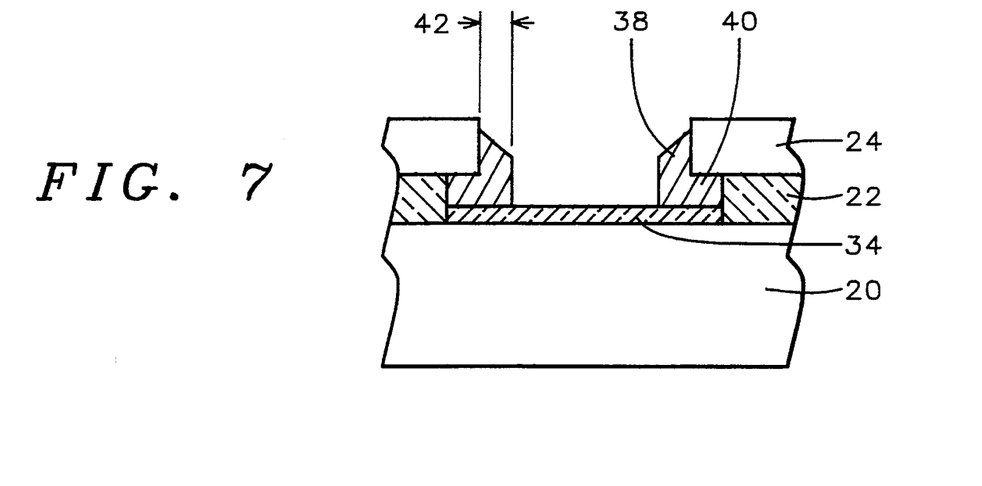

Referring now to FIG. 7, in a critical step in the invention, the polysilicon layer is etched back by anisotropic reactive ion etching using fluorine type etchants such as HBr and Cl$_2$. The process is controlled by time mode to overetch the polysilicon layer, with an overetch of, for example, 1000 Angstroms for a polysilicon layer 36 thickness of 550 Angstroms. Poly spacer 38 is formed adjacent to the sidewall of silicon nitride 24, and poly plug 40 under the nitride and completely filling cavity 30, as seen in FIG. 7. Second pad oxide 34 acts as an etch stop in this step. The poly spacer thickness 42 is between about 300 and 1500 Angstroms. The formation of the poly spacer and poly plug differentiates this invention from the PELOX method discussed above.

As shown in Table I below, the key process parameters for minimizing the bird's beak length are the thickness ($O_{th}$) of second pad oxide 34 and the polyspacer thickness ($PS_{th}$) 42. Table I shows the resultant bird's beak lengths from an experiment in which these thicknesses were varied, and the field oxide thickness was fixed at 6000 Angstroms. As indicated, a bird's beak length close to 0.10 micrometers per side is possible as the second pad oxide gets thinner. However, the minimum oxide thickness is about 60 Angstroms—a thinner oxide could lead to excessive nitride masking stress and could prevent the oxide layer from acting as an etch stop during etching of polysilicon layer 36.

TABLE I

| PSth | Oth: 60 | 120 | 250 | 350 |
|---|---|---|---|---|
| 550 | 0.116 | 0.125 | 0.148 | 0.184 |
| 1000 | 0.136 | 0.134 | 0.151 | n/a |
| 1500 | 0.119 | 0.121 | 0.142 | 0.261 |

(thicknesses in Angstroms, bird's beak length in micrometers/side. n/a = not available)

Figure 7A:
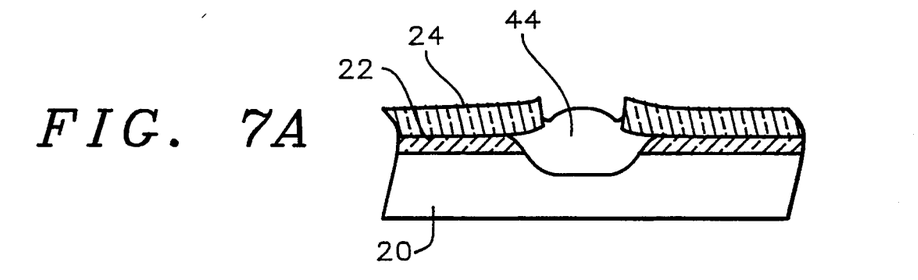

Referring now to FIG. 7A, the field oxide isolation region is formed by exposing the wafer to an oxidizing environment as is well known in the art, at a temperature of between about 900° and 1000° C., for between about 100 and 200 minutes. Poly spacer 38 and poly plug 40 suppress field oxide encroachment into the active device region during oxidation by preventing lateral diffusion of oxidants. This results in a reduced bird's beak length. Spacer 38 and plug 40 are consumed by field oxide isolation region 44 during oxidation. The thickness of the field oxide is between about 4500 and 6000 Angstroms.

Figure 7B:
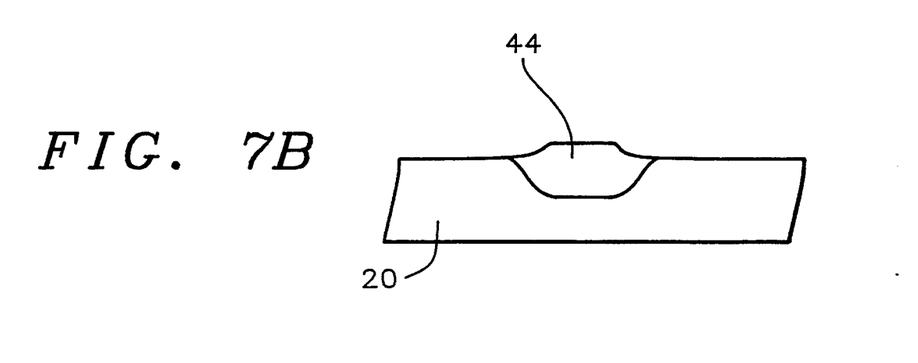

Silicon nitride layer 24 is removed by etching in hot phosphoric acid for between about 30 and 60 minutes, at a temperature of between about 165° and 180° C. The remainder of the first pad oxide is removed by etching in hydrofluoric acid at a ratio of 50H$_2$O:1HF by weight for between about 6 and 20 minutes. A sacrificial oxide with a thickness of between about 100 and 500 Angstroms is thermally grown and then removed by dipping in hydrofluoric acid at a ratio of 50H$_2$O:1HF by weight for between about 6 and 20 minutes, to complete formation of field isolation region 44, as shown in FIG. 7B. This sacrificial oxide growth and removal acts to take away the "white ribbon" which is formed at the intersection of the field oxide corner where the silicon nitride/pad oxide mask had been located.

The final field oxide thickness is between about 3000 and 4500 Angstroms. The final field oxide region using SWAPPI has a smooth surface, which helps prevent the polyline narrowing effect, and has a more planar topography than LOCOS and other prior art techniques provide. For example, the PELOX technique would lead to a thicker field oxide, and thus less planar topography, due to oxidation of the un-removed polysilicon layer in the field isolation region.

Figure 8:
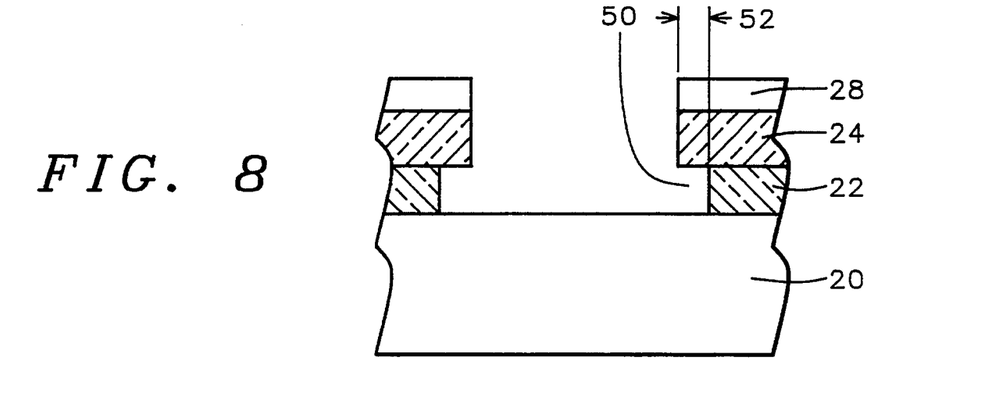

In a further embodiment of the invention, referred to as R-SWAPPI (recessed SWAPPI), processing is as in the first embodiment up to the formation of the structure shown in FIG. 4. Referring now to FIG. 8, photoresist 28 is not removed. Hydrofluoric (HF) acid at a ratio of $50H_2O:1HF$ by weight is used to remove the exposed portion of pad oxide 22 and simultaneously form cavity 50 under silicon nitride 24. This HF etch is for between about 6 and 20 minutes. The cavity depth 52 is between about 300 and 1200 Angstroms.

Figure 9:
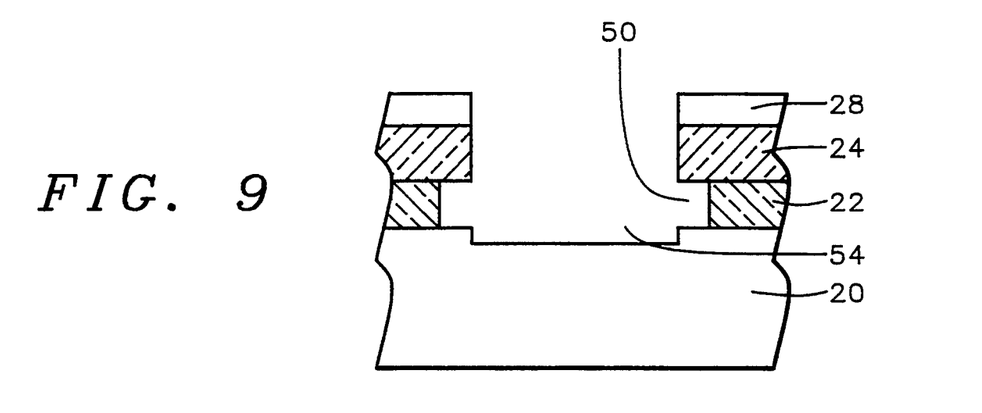

In the key step differentiating this embodiment of the invention, a thickness of the silicon substrate 20 is removed to provide a recessed area 54 in the substrate, as shown in FIG. 9. Photoresist 28 provides the mask to define the area of substrate that is etched by anisotropic reactive ion etching using $SF_6$ to a depth of between about 300 and 1500 Angstroms. The photoresist is then stripped by conventional means.

Figure 10:
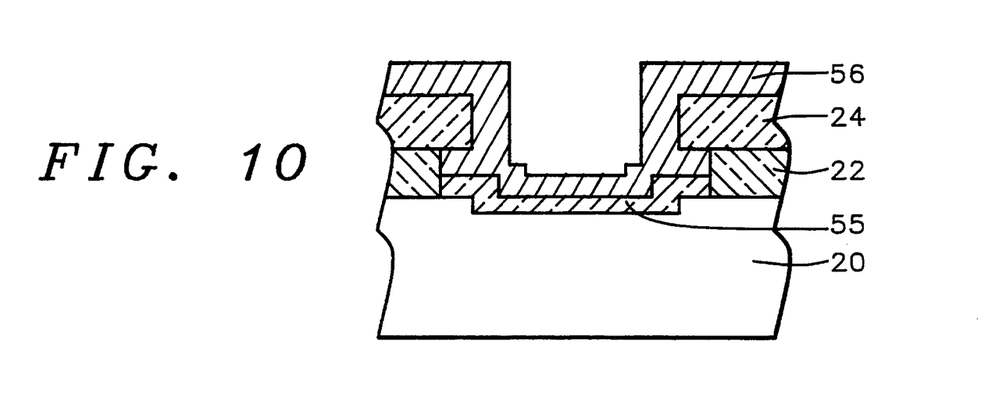

Referring now to FIG. 10, the exposed portion of the silicon substrate is thermally reoxidized in an atmosphere of dry oxygen for between about 10 and 30 minutes and at a temperature of between about 825° and 1000° C. This forms second pad oxide layer 55.

An undoped layer of polysilicon 56 is deposited over the surface of the silicon nitride 24 and pad oxide 55, typically by Low Pressure Chemical Vapor Deposition (LPCVD), at a temperature of between about 610° and 630° C. The thickness is between about 300 and 1500 Angstroms.

Figure 11:
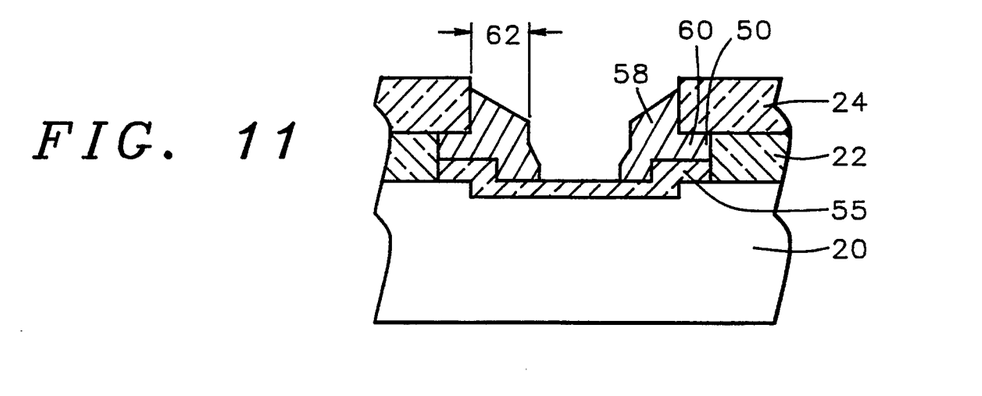

Referring now to FIG. 11, the polysilicon layer is etched back by the same method as in the first embodiment. Poly spacer 58 is formed adjacent to the sidewall of silicon nitride 24 and poly plug 60 remains under the nitride and completely filling cavity 50. Second pad oxide 55 acts as an etch stop in this step. The poly spacer thickness 62 is between about 300 and 1500 Angstroms. The formation of the poly spacer and poly plug also differentiates this embodiment from the PELOX method discussed above.

As shown in Table II below, the key process parameters for minimizing the bird's beak length are the recess depth in the silicon substrate and the polyspacer thickness ($PS_{th}$) 62. Table II shows the resultant bird's beak lengths from an experiment in which these thicknesses were varied and the field oxide thickness was fixed at 6000 Angstroms. As indicated, a bird's beak length close to 0.12 micrometers per side is possible. The poly spacer depth strongly affects the bird's beak length.

TABLE II

| PSth | Recess: | | | | | |
|---|---|---|---|---|---|---|
| | 0 | 300 | 600 | 900 | 1200 | 1500 |
| 1000 | n/a | 0.492 | 0.525 | 0.553 | n/a | 0.629 |
| 1500 | 0.160 | 0.128 | 0.150 | 0.150 | 0.175 | 0.328 |

(thicknesses in Angstroms, bird's beak length in micrometers/side. n/a = not available)

Figure 11A:
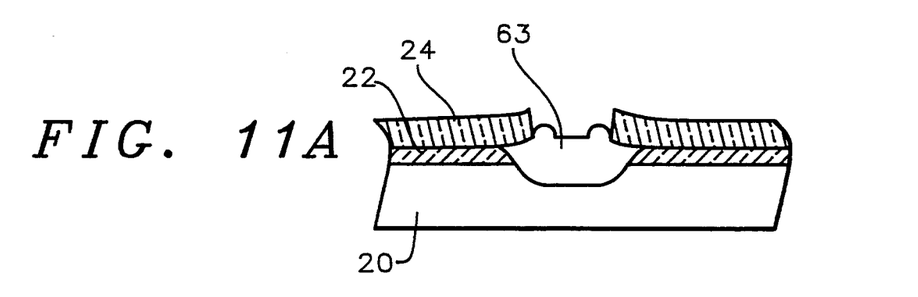

Referring now to FIG. 11A, the field oxide isolation region 63 is formed by exposing the wafer to an oxidizing environment as is well known in the art, at a temperature of between about 900° and 1000° C., for between about 100 and 200 minutes. Poly spacer 58 and poly plug 60 suppress field oxide encroachment into the active device region during oxidation by preventing lateral diffusion of oxidants. This results in a reduced bird's beak length. Spacer 58 and plug 60 are consumed by field oxide isolation regions 63 during oxidation. The thickness of the field oxide is between about 4500 and 6000 Angstroms.

Figure 11B:
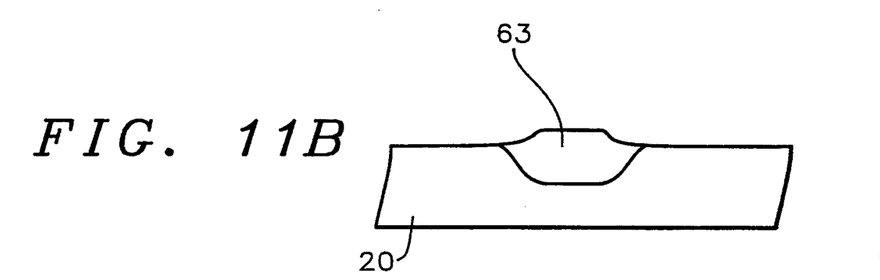

Silicon nitride layer 24 is now removed by etching in hot phosphoric acid for between about 30 and 60 minutes, at a temperature of between about 165° and 180° C. The remainder of the first pad oxide is removed by etching in hydrofluoric acid at a ratio of $50H_2O:1HF$ by weight for between about 6 and 20 minutes. A sacrificial oxide with a thickness of between about 100 and 500 Angstroms is thermally grown and then removed by dipping in hydrofluoric acid at a ratio of $50H_2O:1HF$ by weight for between about 6 and 20 minutes, to complete formation of field isolation region 63, as shown in FIG. 11B. The final field oxide thickness is between about 3000 and 4500 Angstroms. The final field oxide using the R-SWAPPI method has a smooth surface, which helps prevent the polyline narrowing effect, and has a more planar topography than LOCOS and PELOX, partly due to the formation of the recessed area prior to field oxidation, which results in the field oxide being fully recessed into the substrate.

Figure 12:
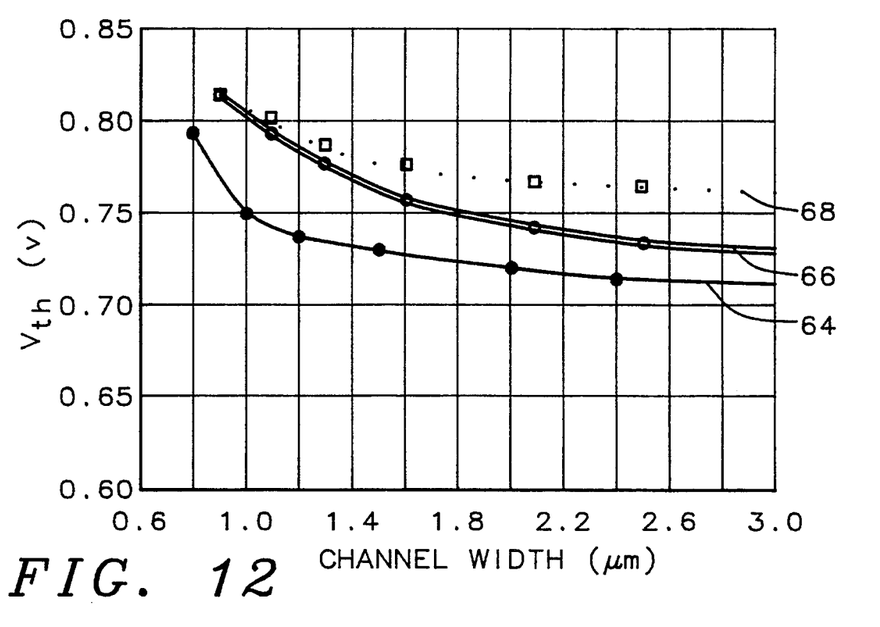
FIGS. 12 and 13 are graphical representations of electrical characteristics of devices resulting from the isolation methods described in the invention.
Figure 13:
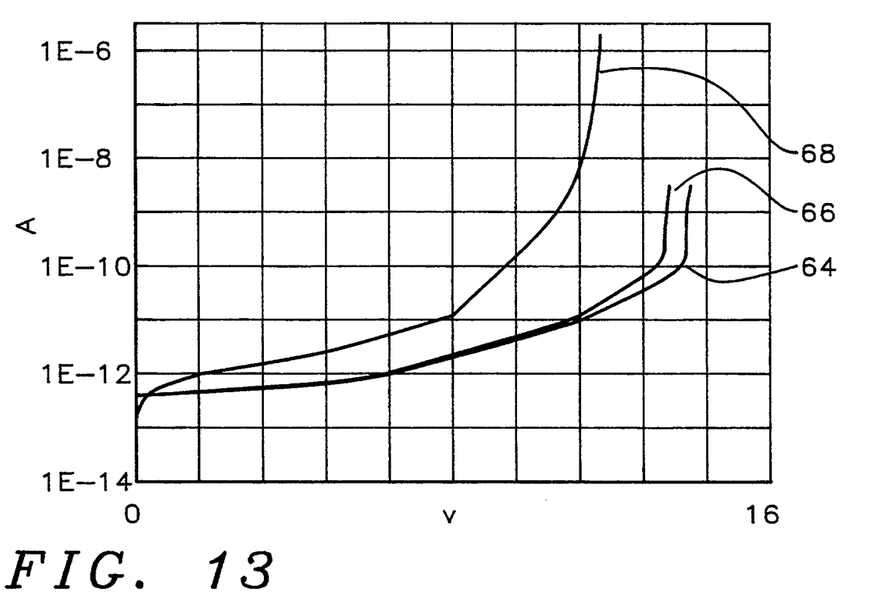

Referring now to FIG. 12, experimental results indicate that SWAPPI 66 and R-SWAPPI 68 result in similar electrical performance to LOCOS 64, for such parameters as threshold voltage and narrow width effect (see FIG. 12). Junction leakage current (see FIG. 13) is slightly worse for R-SWAPPI 68, probably due to crystal defects resulting from the recessed etch. Gate oxide integrity is slightly better for LOCOS than for the two embodiment methods.

While the invention has been particularly shown and described with reference to the preferred embodiments thereof, it will be understood by those skilled in the art that various changes in form and details may be made without departing from the spirit and scope of the invention.

What is claimed is:

1. A method of forming a field oxide isolation region on and in the surface of a silicon substrate, comprising:
    forming a first layer of pad oxide on the surface of said silicon substrate;
    forming a layer of silicon nitride on the surface of said first pad oxide layer;
    patterning said silicon nitride layer and a partial thickness of said first pad oxide layer to form opening for said field oxide isolation region;
    removing said first pad oxide layer in the area defined by said opening to expose a portion of said silicon substrate, and simultaneously forming a cavity by removing a portion of said first pad oxide layer under said silicon nitride layer;
    forming a second pad oxide layer by oxidizing said exposed portion of said silicon substrate and said first pad oxide layer;
    depositing a layer of polysilicon over the surfaces of said second pad oxide layer and said silicon nitride layer, and inside said cavity;
    forming a polysilicon spacer adjacent to said silicon nitride layer and a polysilicon plug in said cavity by etching said polysilicon layer;

forming said field oxide isolation region in and on said silicon substrate, by thermal oxidation of said silicon substrate, whereby said polysilicon spacer and said polysilicon plug are consumed;

removing said silicon nitride layer;

removing the remainder of said first pad oxide layer;

forming a sacrificial oxide layer on the surface of said substrate; and removing said sacrificial oxide layer to complete said field oxide isolation region.

2. The method of claim 1 wherein said cavity has a depth of between about 300 and 1200 Angstroms and is formed by etching with hydrofluoric acid for between about 6 and 20 minutes.

3. The method of claim 1 wherein said second pad oxide layer has a thickness of between about 60 and 100 Angstroms.

4. The method of claim 1 wherein said polysilicon spacer has a thickness of between about 300 and 1500 Angstroms.

5. The method of claim 1 wherein said field oxide isolation region is grown to a thickness of between about 4500 and 6000 Angstroms.

6. A method of forming a field oxide isolation region on and in the surface of a silicon substrate, comprising:

forming a first layer of pad oxide on the surface of said silicon substrate;

forming a layer of silicon nitride on the surface of said first pad oxide layer;

patterning said silicon nitride layer and a partial thickness of said first pad oxide layer to form opening for said field oxide isolation region;

removing said first pad oxide layer in the area defined by said opening to expose a portion of said silicon substrate, and simultaneously forming a cavity by removing a portion of said first pad oxide layer under said silicon nitride layer;

removing a thickness of said silicon substrate to provide a recessed area in the substrate, to a depth of between about 300 and 1500 Angstroms;

forming a second pad oxide layer by oxidizing said silicon substrate;

depositing a layer of polysilicon over the surfaces of said second pad oxide layer and said silicon nitride layer, and inside said cavity;

forming a polysilicon spacer adjacent to said silicon nitride layer and a polysilicon plug in said cavity by etching said polysilicon layer;

forming said field oxide isolation region in and on said silicon substrate, by thermal oxidation of said silicon substrate, whereby said polysilicon spacer and said polysilicon plug are consumed;

removing said silicon nitride layer;

removing the remainder of said first pad oxide layer;

forming a sacrificial oxide layer on the surface of said substrate; and removing said sacrificial oxide layer to complete said field oxide isolation region.

7. The method of claim 6 wherein said thickness of silicon substrate is removed by a plasma dry etch.

8. The method of claim 6 wherein said cavity has a depth of between about 300 and 1200 Angstroms, and is formed by etching with hydrofluoric acid for between about 6 and 20 minutes.

9. The method of claim 6 wherein said second pad oxide layer has a thickness of between about 60 and 100 Angstroms.

10. The method of claim 6 wherein said polysilicon spacer has a thickness of between about 300 and 1500 Angstroms.

11. The method of claim 6 wherein said field oxide isolation region is grown to a thickness of between about 4500 and 6000 Angstroms.

12. A method of isolating semiconductor devices on a silicon substrate, comprising:

forming a first layer of pad oxide on the surface of said silicon substrate;

forming a layer of silicon nitride on the surface of said first pad oxide layer;

patterning said silicon nitride layer and a partial thickness of said first pad oxide layer to form an opening;

removing said first pad oxide layer in the area defined by said opening to expose a portion of said silicon substrate, and simultaneously forming a cavity by removing a portion of said first pad oxide layer under said silicon nitride layer;

forming a second pad oxide layer by oxidizing said exposed portion of said silicon substrate and said first pad oxide layer;

depositing a layer of polysilicon over the surfaces of said second pad oxide layer and said silicon nitride layer, and inside said cavity;

forming a polysilicon spacer adjacent to said silicon nitride layer and a polysilicon plug in said cavity by etching said polysilicon layer;

forming a field oxide isolation region in and on said silicon substrate, by thermal oxidation of said silicon substrate, whereby said polysilicon spacer and said polysilicon plug are consumed, to isolate said semiconductor devices;

removing said silicon nitride layer;

removing the remainder of said first pad oxide layer;

forming a sacrificial oxide layer on the surface of said substrate; and removing said sacrificial oxide layer to complete said field oxide isolation region.

13. The method of claim 12 wherein said cavity has a depth of between about 300 and 1200 Angstroms, and is formed by etching with hydrofluoric acid for between about 6 and 12 minutes.

14. The method of claim 12 wherein said second pad oxide layer has a thickness of between about 60 and 100 Angstroms.

15. The method of claim 12 wherein said polysilicon spacer has a thickness of between about 300 and 1500 Angstroms.

16. The method of claim 12 wherein said field oxide isolation region is grown to a thickness of between about 4500 and 6000 Angstroms.

17. A method of isolating semiconductor devices on a silicon substrate, comprising:

forming a first layer of pad oxide on the surface of said silicon substrate;

forming a layer of silicon nitride on the surface of said first pad oxide layer;

patterning said silicon nitride layer and a partial thickness of said first pad oxide layer to form an opening;

removing said first pad oxide layer in the area defined by said opening to expose a portion of said silicon substrate, and simultaneously forming a cavity by removing a portion of said first pad oxide layer under said silicon nitride layer;

removing a thickness of said silicon substrate, to provide a recessed area in said substrate, to a depth of between about 300 and 1500 Angstroms;

forming a second pad oxide layer by oxidizing said exposed portion of said silicon substrate;

depositing a layer of polysilicon over the surfaces of said second pad oxide layer and said silicon nitride layer, and inside said cavity;

forming a polysilicon spacer adjacent to said silicon nitride layer and a polysilicon plug in said cavity by etching said polysilicon layer;

forming a field oxide isolation region in and on said silicon substrate, by thermal oxidation of said silicon substrate, whereby said polysilicon spacer and said polysilicon plug are consumed, to isolate said semiconductor devices;

removing said silicon nitride layer;

removing the remainder of said first pad oxide layer;

forming a sacrificial oxide layer on the surface of said substrate; and removing said sacrificial oxide layer to complete said field oxide isolation region.

18. The method of claim 17 wherein said thickness of silicon substrate is removed by a plasma dry etch.

19. The method of claim 17 wherein said cavity has a depth of between about 300 and 1200 Angstroms, and is formed by etching with hydrofluoric acid for between about 6 and 20 minutes.

20. The method of claim 17 wherein said second pad oxide layer has a thickness of between about 60 and 100 Angstroms.

21. The method of claim 17 wherein said polysilicon spacer has a thickness of between about 300 and 1500 Angstroms.

22. The method of claim 17 wherein said field oxide isolation region is grown to a thickness of between about 4500 and 6000 Angstroms.

* * * * *